United States Patent [19]

Zappella et al.

[11] Patent Number: 5,091,288
[45] Date of Patent: Feb. 25, 1992

[54] METHOD OF FORMING DETECTOR ARRAY CONTACT BUMPS FOR IMPROVED LIFT OFF OF EXCESS METAL

[75] Inventors: Pierino I. Zappella, Garden Grove; Angel A. Pepe, Irvine; William R. Fewer, Diamond Bar; Eugene J. Babcock, Garden Grove, all of Calif.

[73] Assignee: Rockwell International Corporation, El Segundo, Calif.

[21] Appl. No.: 428,371

[22] Filed: Oct. 27, 1989

[51] Int. Cl.$^5$ .............................................. G03C 5/16
[52] U.S. Cl. .................................. 430/311; 430/312; 430/315
[58] Field of Search ............... 430/312, 313, 314, 317, 430/311, 315; 428/620

[56] References Cited

U.S. PATENT DOCUMENTS

| | | |
|---|---|---|
| 3,977,071 | 8/1976 | Jarman . |
| 4,088,490 | 3/1980 | Duke et al. ........................ 430/312 |
| 4,301,591 | 11/1981 | Withers . |
| 4,321,615 | 3/1982 | Blackman et al. . |
| 4,387,154 | 6/1983 | Whitmore . |
| 4,435,462 | 3/1984 | Withers . |
| 4,439,912 | 4/1984 | Pollard et al. . |
| 4,443,303 | 4/1984 | Freeman . |
| 4,533,624 | 8/1985 | Sheppard ........................... 430/314 |
| 4,555,720 | 11/1985 | Readhead . |
| 4,564,584 | 1/1986 | Fredericks et al. . |
| 4,906,552 | 3/1990 | Ngo et al. ........................ 430/312 |

FOREIGN PATENT DOCUMENTS 0006830 1/1986 Japan ................................. 430/312

Primary Examiner—Marion E. McCamish
Assistant Examiner—S. Rosasco
Attorney, Agent, or Firm—H. Frederick Hamann; George A. Montanye; David J. Arthur

[57] ABSTRACT

An improved method of forming metal contact bumps for infrared detector array includes depositing a thick layer of positive organic photoresist, and exposing the entire layer to light. A second, substantially thinner layer of photoresist is then applied, and exposed with a pattern of light corresponding to the contact bumps desired. The photoresist is developed to resolve the pattern in the top thin film, and the underlying thick resist is isotropically developed down to the substrate surface and under a portion of the remaining unexposed top layer. the metal to form the contact bumps is then deposited, preferably by evaporative deposition. The overhanging edges of the top layer of photoresist prevent continuous metal step coverage between the surface of the photoresist layer and the bumps formed on the substrate surface in the cavity. The remaining photoresist is then dissolved, and the metal deposited on the surface of the second layer is readily removed.

17 Claims, 3 Drawing Sheets

METHOD OF FORMING DETECTOR ARRAY CONTACT BUMPS FOR IMPROVED LIFT OFF OF EXCESS METAL

BACKGROUND OF THE INVENTION

The present invention relates to the formation of contact bumps or columns for infrared radiation detector arrays.

Such arrays of bumps are formed on a substrate. The substrate may be a wafer of silicon integrated circuits, or a wafer of infrared detector arrays, or other material.

In the prior art, an organic positive photoresist is applied to the surface of the substrate. A mask is applied to the surface of the photoresist, which mask has openings where the columns are to be formed. These portions of the photoresist are exposed to UV light through the openings in the mask. The photoresist is then developed, which removes the positive photoresist that was exposed to the light through the mask, forming openings through the photoresist to the substrate surface where the contact bumps are to be formed.

The contact material, such as indium, is then deposited. The entire wafer surface is coated with the metal, filling the holes in the photoresist and coating the surface of the remaining photoresist. The metal is deposited by electroplating, E-beam deposition, evaporation, or sputtering, all of which are known in the art.

The next step is to dissolve the photoresist from under the indium, so the indium layer can be removed, leaving only the indium bumps on the substrate surface. To be able to dissolve the photoresist, the solvent must have access to the photoresist, which requires that openings be present through the indium.

The most likely place for such openings to be formed are the corners at the edges of the holes in the photoresist. If the corners at the edges of the photoresist are sharp, as they would be if the edges of the photoresist were vertical, such as shown in FIG. 1, a little ultrasonic agitation could break through the small amount of indium at the corners 13 of the photoresist 15, providing the necessary access. Unfortunately, attempts to control the sidewall slope by exposure, contrasts enhancement material, developer concentration, and clorobenzene soak have not been successful for thick positive photoresist of 5–50 microns in thickness. In actual practice, the holes in the photoresist tend to have gently sloped edges, providing areas for the detector material to adhere in relatively thick layers and reducing the sharp corners that are likely to provide places for holes to develop in the detector material. An example is shown in FIG. 2. Thus, extensive ultrasonic agitation has been required to form openings through the indium "to provide access for the solvent to the photoresist 14."

Another method used to form the conductive pads or bumps is to initially coat the substrate surface with the conductive material (indium). Positive photoresist is then applied on top of the indium layer to define the future pads. The unwanted indium is etched away, leaving only the pads desired. This method requires careful control of the etch, which in turn requires tight control of the etching agent. Consequently, formation of uniform bumps or pads is extremely difficult.

SUMMARY OF THE INVENTION

The present invention is a method of forming an array of contact bumps for a radiation detector array. The method includes forming on a substrate surface a layer of a first material having a plurality of cavities formed in it, with each cavity having an opening at its top surrounded by an overhanging lip of the first material. Conductive material is deposited into the cavities to form the conductive bumps and onto the surface of the first material. The first material is dissolved from under the conductive layer, and the conductive layer is removed.

The step of forming the layer of first material includes depositing a first layer of the material, depositing a second layer of the material, and forming openings through the second layer of materials. A portion of the first layer of material under the openings and under the edges of the second layer around the openings is removed to form the overhanging lips of the second layer around the openings.

The step of depositing the first layer of the material includes depositing a first layer of organic positive photoresist and exposing that layer to light. The step of depositing the second layer of material includes depositing a second layer of organic positive photoresist. The step of forming openings through the second layer of material includes exposing the second layer of photoresist to a pattern of light to form an exposed pattern in the second layer of photoresist, and developing the second layer of photoresist to remove the exposed pattern. The step of forming a plurality of cavities in the first layer of material includes developing the first layer of photoresist under the exposed pattern of the second layer and under a portion of the second layer of photoresist around the openings in that second layer.

DETAILED DESCRIPTION OF THE PREFERRED EMBODIMENT

The present invention is a novel method of forming the individual conductor elements for connection to the detector elements of an infrared detector array. Virtually any substrate material can accommodate the techniques of the invention. Thus, the invention can be used to build pads on silicon integrated circuit wafers, mercury-cadmium-telluride infrared detector wafers, or on ceramic or glass wafers. The method can also be used on other types of substrates.

Figure 1:
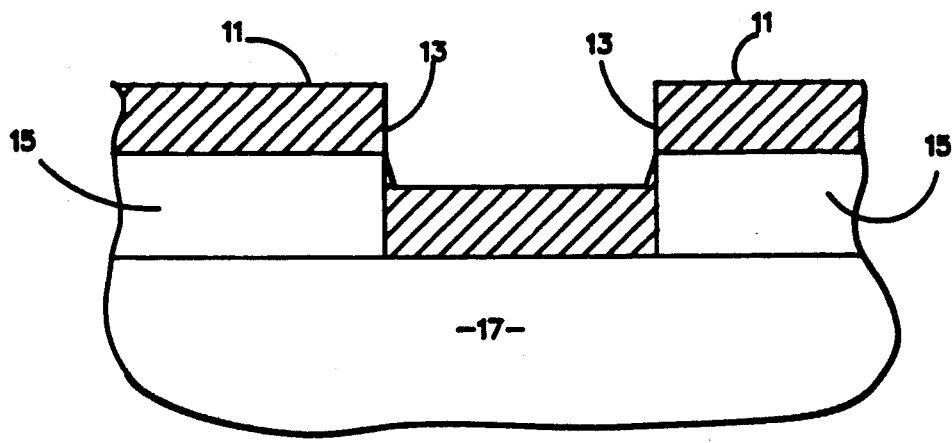
FIG. 1 is a cross-sectional view of a photoresist layer having an ideal contact bump opening and a layer of contact material.
Figure 2:
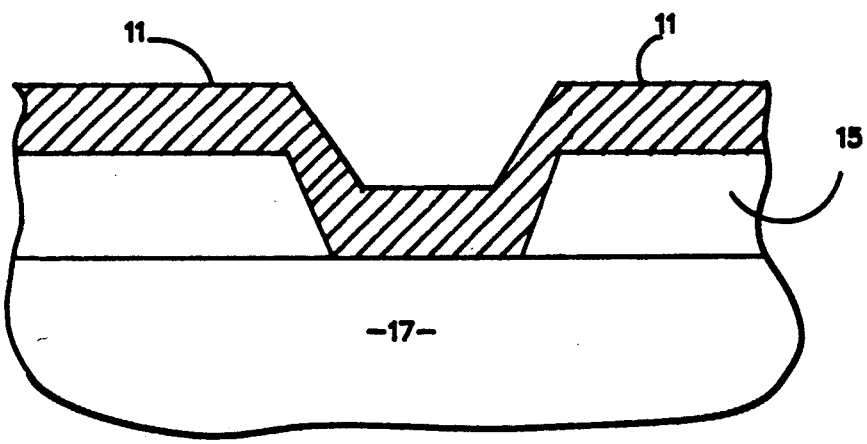
FIG. 2 is a cross-sectional view of a photoresist layer having a typical contact bump opening formed using conventional techniques and a layer of contact material.
Figure 3:
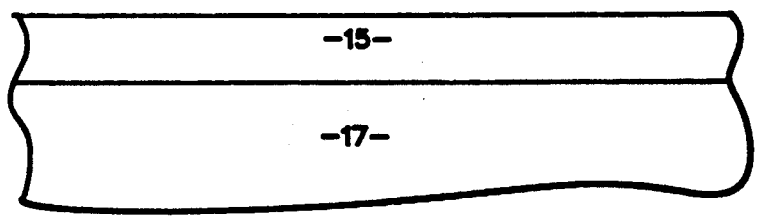
FIG. 3 is a cross-sectional view of a layer of photoresist applied to a substrate in accordance with the invention.

Referring to FIG. 3, a substantially uniform layer of photoresist 15 is applied to or deposited on the surface of a substrate 17 in a conventional manner, generally by spin coating the substrate wafer. An organic positive photoresist that dissolves during developing after exposure to light is preferred. A photoresist suitable for thick applications should be used. A preferred photoresist is AZ4620, commercially available from American Hoechst Corporation.

The photoresist is deposited to a thickness of 12–20 microns, in most applications. The thickness of the photoresist is preferably slightly greater than the desired height of the contact pads. Thus, the thickness may be as great as 50 microns. To obtain this thickness, it may be necessary or desirable to apply the photoresist in more than one spin coating of the substrate. In accordance with the recommendations of the photoresist manufacturer, each spin coating is followed by a low temperature pre-bake or "soft" bake.

This entire layer of photoresist is subjected to a blanket exposure of ultraviolet (UV) light. If multiple coats of the positive photoresist are applied, each coat may be exposed as it is applied. But, in most cases, it is not necessary to expose each layer of photoresist individually. A single blanket UV exposure after all the layers have been deposited is sufficient. Regardless of whether the photoresist is deposited in a single application or in multiple applications, the result is a single uniform layer of substantially uniformly exposed positive photoresist.

As an alternative to a blanket exposure of the layer of positive photoresist 15, the photoresist could be exposed through a mask having openings located where the contact bumps are to be formed, which openings are at least as large as the contact bumps are to be. Using such a confinement or containment mask will limit the size of openings formed later in the first layer of photoresist 15.

Figure 4:
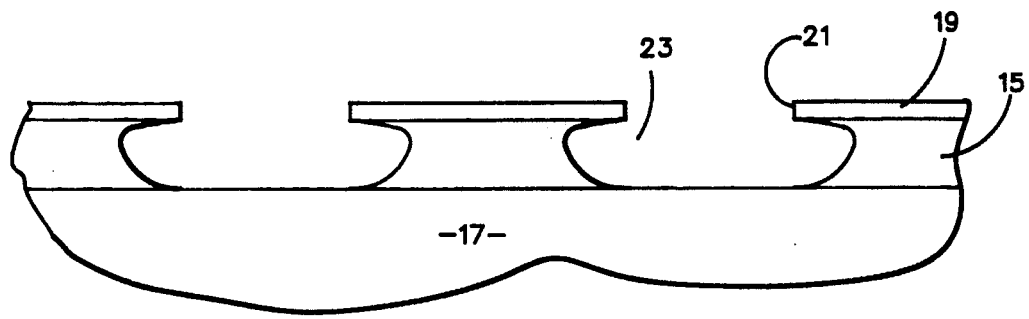
FIG. 4 is a cross-sectional view of layers of photoresist having cavities formed in accordance with the invention.

A relatively thin second or top coat of photoresist 19 is applied to the surface of the uniformly exposed first layer of photoresist (FIG. 4). This layer may be formed of the same type of positive photoresist AZ4620. This second layer of photoresist may be 3–12 microns thick. The second layer may be as thin as practical, as openings through it will be used to define the pads. The thinner this layer, the finer the tolerances that can be achieved in forming the conductor pads.

The second layer 19 is then subjected to a low temperature pre-bake according to the manufacturer's instructions.

The second layer 19 is exposed to a pattern of light corresponding to the contact bumps desired to be formed. This exposure may be through a mask placed over the surface of the second layer. Openings in the mask permit light to pass to the photoresist. The exposed pattern consists of squares approximately 5 microns to 100 microns across. This forms in the top layer of photoresist a first, exposed pattern for the contact bumps that has the same photo-developing characteristics as the underlying layer or layers of photoresist 15. The remaining unexposed portion of the second layer forms a second, unexposed pattern.

The photoresist is developed in a conventional manner in accordance with the manufacturer's recommendations. During developing, the exposed pattern of the top layer of photoresist is dissolved, yielding openings 21 through the second layer 19. The unexposed second pattern portion of the top layer will either not dissolve at all, or will dissolve at only a significantly slower rate than that of the exposed pattern.

After the pattern in the second layer has been dissolved, the developing process is continued, to dissolve the portions of the first layer of photoresist 15 under the openings 21 formed in the second layer. The first layer of photoresist dissolves isotropically during developing at approximately the same rate as the exposed pattern in the second layer. The developing of the first layer of photoresist is continued until the surface of the substrate 17 is exposed.

Figure 5:
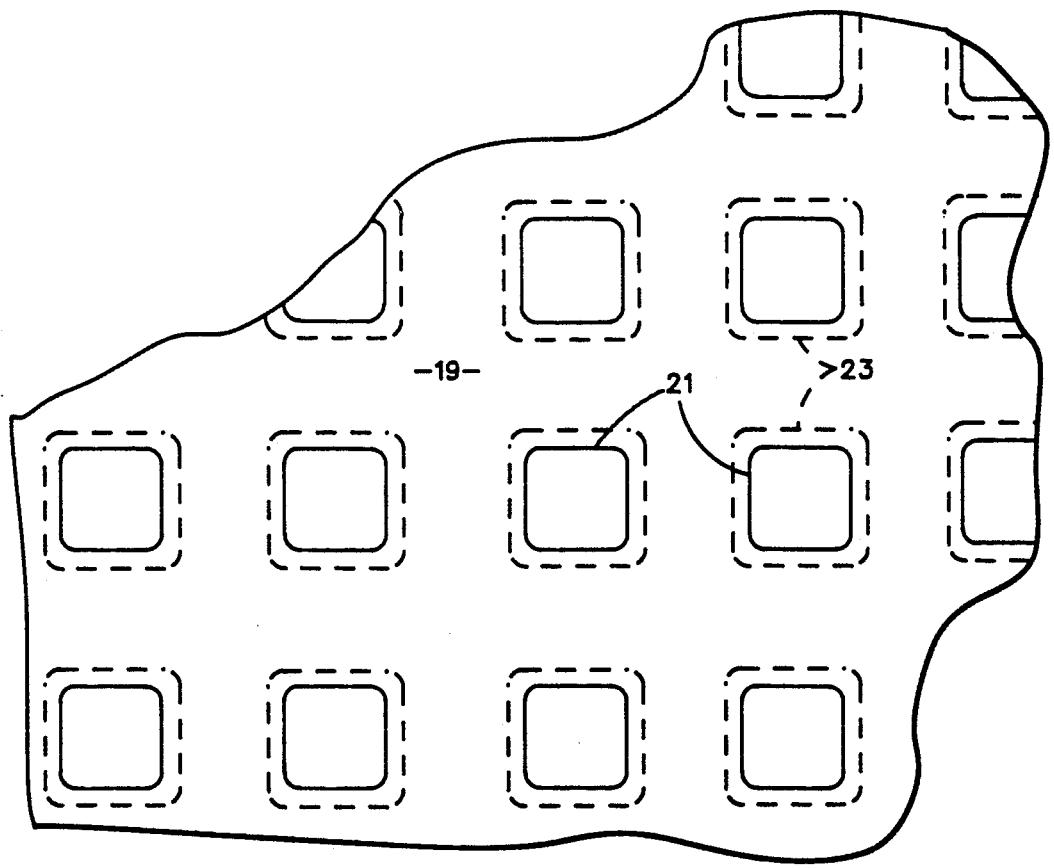
FIG. 5 is a top view of a portion of a wafer having layers of photoresist and having a plurality of cavities formed in the photoresist in accordance with the invention.

The developing process is continued so that a portion of the first photoresist layer under the unexposed portion of the second photoresist is dissolved, forming a cavity 23 under and around the openings 21 formed by the exposed pattern in the top layer of photoresist. These cavities undercut the edges of the remaining second photoresist layer 19 around each opening 21, leaving an overhang or lip of the second layer of photoresist. But the developing is not allowed to continue so long as to eliminate the photoresist 15 between adjacent cavities 23. Structural support between the cavities is required to maintain separation for later formation of separate contact bumps. FIG. 5 shows a top plan view of the openings 21 through the top layer of photoresist 19. The phantom lines illustrate the edges of the cavities 23 in the underlying layer of photoresist 15.

If a mask was used to exposed the underlying layer of photoresist 15, the developing will stop when the exposed photoresist has dissolved, leaving the unexposed photoresist of the underlying layer 15. The cavities 23 will then be formed from the exposed portions of the first photoresist layer 15.

Figure 6:
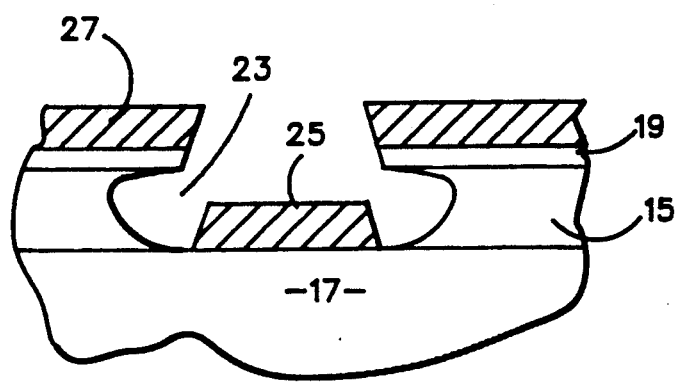
FIG. 6 is a cross-sectional view of layers of photoresist having a cavity formed and having a layer of contact material deposited to form a contact bump in the cavity, in accordance with the invention.

The contact material such as a metal such as indium is then deposited on the wafer (see FIG. 6). This deposition deposits a mound of the metal 25 on the substrate surface inside each cavity 23, and also applies a layer of metal 27 to the surface of the second photoresist layer. Depending on the desired height for the contact bumps, multiple applications of the contact material may be necessary.

A preferred method of depositing the metal is by evaporation, in which the wafer is placed on the inside of an evaporation chamber with an evaporative source of the metal. Preferably, the wafer is placed normal to the evaporation source to ensure that the metal, as it is deposited on the wafer, passes through the openings in the second photoresist layer into the cavity and onto the substrate surface. The overhanging lip of the second layer of photoresist prevents continuous metal step coverage between the metal forming the contact bump and the metal on the surface of the second photoresist layer. It is also desired that the amount of metal on the edge or the underside of the overhang or step formed by the second layer of photoresist is kept to an absolute minimum, preferably zero. Minimizing such step coverage will improve the later removal of the metal that is deposited on the surface of second layer of photoresist.

Cooling of the evaporation chamber during evaporative deposition of the detector material is required to avoid overheating the substrate or the photoresist. As it is known to those skilled in the art, excessive heat can ruin a mercury-cadmium-telluride substrate. Excessive heat can also "fry" the photoresist, turning it into an epoxy-like material that is extremely difficult to dissolve later. A preferred method of cooling inside the evaporation chamber is through a circulating water system, which can effectively keep the wafers inside the chamber cool, while not interfering with the evaporation process.

Evaporative deposition of the metal is preferred over electroplating. Evaporation produces bumps of more uniform height, which is important for later mating of the array of conductor bumps to an array of detector elements.

After sufficient metal has been deposited to form the bumps, the exposed photoresist of the first layer 15, and the remaining unexposed photoresist of the second layer 19 is dissolved using a solvent such as acetone in a conventional manner (as recommended by the photoresist manufacturer), leaving the metal 27 that had been on the surface of the second layer of photoresist. This metal may then be readily removed by simply lifting it off and recycled, leaving the contact bumps 25 on the surface of the wafer substrate.

Gentle ultrasonic agitation may shorten the time necessary for removing the remaining photoresist from the wafer. Consequently, the processing time for dissolving the underlying photoresist and removing the excess indium may be reduced to approximately one to four hours, rather than several days, as was frequently necessary with the techniques of the prior art.

Figure 7:
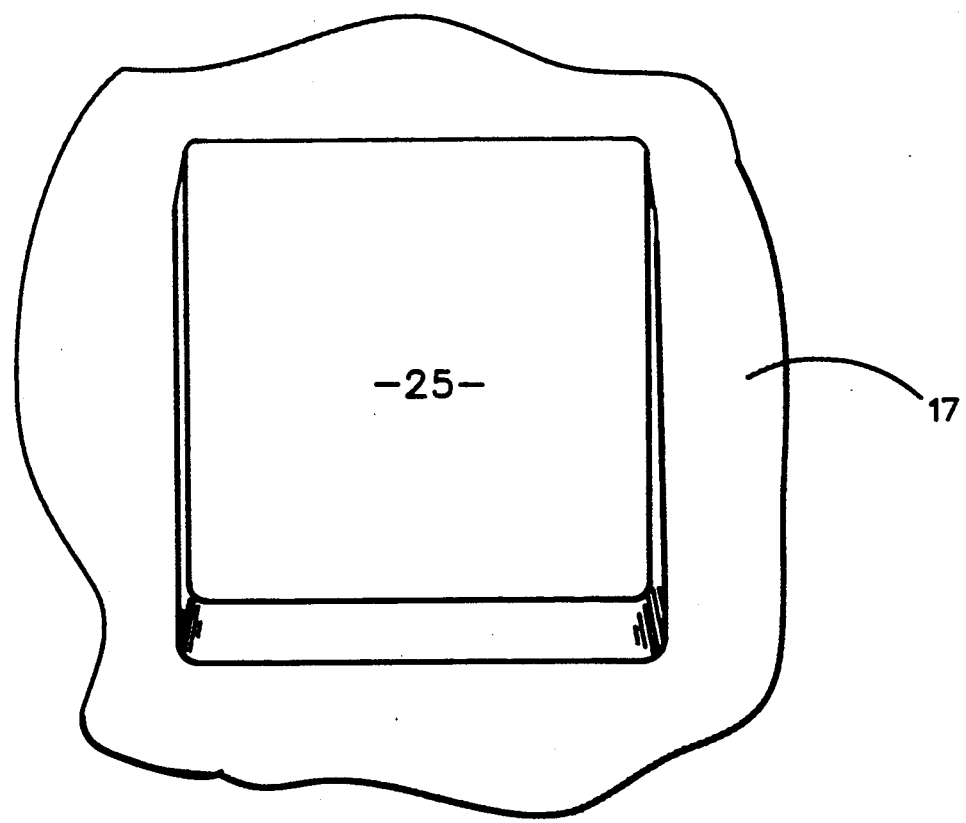
FIG. 7 is a perspective view of a contact bump formed in accordance with the invention, after removal of the photoresist and excess contact material.

FIG. 7 shows a perspective view of an indium bump 25 formed using the method of the invention. The sides of the bump taper in toward the top. Using the evaporative deposition technique for applying the indium, the bump has a substantially smooth, flat top surface. Such a flat surface facilitates later mating the bump with a detector element of a radiation detector array.

The process may leave a thin "halo" of indium on the substrate surface around the pad. This halo is generally less than 500 Å. If its removal is desired, a brief (10–15 sec) etch with a carefully controlled etching solution may be performed. As suitable etching solution is a mixture of 70% $HNO_3$ (in distilled water) and 49% HF (in distilled water), with the mixture diluted at the ratio of one part solution to three parts distilled water. This solution etches laterally and vertically at the same rate, which is approximately 75 Å per second, or 0.4 microns per minute.

An advantage to the invention is that the openings and cavities for the formation of the indium bumps are observable before any indium is deposited onto the photoresist. As the photoresist is readily reworkable, errors can be corrected inexpensively. In contrast, the method of depositing a layer of indium and then etching away the unwanted portion does not readily permit reworking if an error is made during the etching step.

While the invention has been described using organic positive photoresist, those skilled in the art will recognize that other techniques may be used to implement the invention. Those skilled in the art will recognize that other types of materials and parameters involving the various steps may be used without departing from the spirit of the invention as defined in the following claims.

We claim:

1. A method of forming a plurality of contact bumps on a substrate, comprising:

depositing on a substrate a first layer of organic positive photoresist;

exposing said first layer of photoresist to a first pattern of light to form in said first layers of photoresist a first portion capable of being dissolved by an agent at a first rate;

depositing on said exposed first layer a second layer of organic positive photoresist;

exposing said second layer to a second pattern of light to form in said second layer of photoresist a second pattern portion capable of being dissolved by said agent at substantially said first rate, and a third portion that is either incapable of being dissolved by said agent, or is dissolved by said agent at a second rate, substantially slower than said first rate;

dissolving with said agent said second pattern portion of said second layer and at least some of said first portion of said first layer under said second pattern portion of said second layer and under a portion of said third pattern portion of said second layer to form openings through said second layer and said first layer to said substrate;

depositing contact material on the surface of said third pattern portion of said second layer and through said openings onto said substrate to form a layer of contact material on the surface of said second layer of material, and a pattern of contact bumps on the surface of said substrate;

dissolving said first and second layers of material under said contact material; and removing said layer of contact material.

2. The method of claim 1, wherein said first pattern portion is an array of closed shapes.

3. The method of claim 2, wherein said closed shapes are substantially uniform in size and shape.

4. The method of claim 3, wherein said detector material is a metal.

5. The method of claim 4, wherein said detector material is indium.

6. The method of claim 1, wherein said step of depositing said detector material comprises evaporative deposition of said detector material.

7. The method of claim 1 wherein said step of exposing said first layer of photoresist to a first pattern of light comprises substantially uniformly exposing said first layer of photoresist to light.

8. The method of claim 1 wherein the light patterns in said first pattern of light correspond to and are slightly larger than the light patterns in said second pattern of light.

9. The method of claim 1 wherein said step of exposing said second layer to a second pattern of light comprises exposing said second layer to a pattern of light corresponding to and smaller than said first pattern of light.

10. A method of forming a plurality of bumps on a substrate, comprising:

depositing on a substrate a first layer of positive photoresist having a thickness between approximately five microns and approximately fifty microns;

exposing said first layer of positive photoresist to a first pattern of light;

depositing on said exposed first layer of positive photoresist a second layer of positive photoresist having a thickness between approximately three microns and approximately twelve microns;

exposing said second layer of photoresist with a second pattern of light to form an exposed photoresist pattern;

developing said second layer of photoresist to remove said exposed photoresist pattern to form openings through said second layer of photoresist having edges surrounding said openings;

continuing said developing to remove photoresist of said first layer of photoresist under said exposed photoresist pattern down to said substrate, and so that a portion of said first layer of photoresist is removed from underneath the edges of said second layer of photoresist around said openings;

depositing detector material on the surface of said second photoresist layer through said openings to form a layer of detector material on the surface of said second layer of photoresist and to form a detector pattern of detector material corresponding to said photoresist pattern on said substrate;

exposing said photoresist to a solvent to dissolve substantially all of said first and second layers of photoresist; and removing said layer of detector material except for the pattern formed on the substrate surface.

11. The method of claim 10, wherein said step of depositing said detector material comprises evaporative deposition of a metal.

12. The method of claim 11, wherein said step of exposing said first layer of positive photoresist to said first pattern of light comprises exposing said first layer of positive photoresist to a substantially uniform light.

13. The method of claim 11, wherein said step of exposing said first layer of positive photoresist to said first pattern of light comprises exposing said first layer of positive photoresist to a pattern of light corresponding to and larger than said second pattern of light.

14. The method of claim 11, wherein the light patterns in said second pattern correspond to and are slightly smaller than the light patterns in said first pattern of light.

15. A method of forming an array of contact bumps for a radiation detector array, comprising:

depositing a first layer of organic positive photoresist;

exposing at least portions of said first layer of photoresist to light;

depositing a second layer of organic positive photoresist on top of said exposed first layer of photoresist;

forming openings through said second layer of photoresist to said first layer of photoresist by:

exposing said second layer of photoresist to a pattern of light to form an exposed pattern in said second layer of photoresist; and developing said second layer of photoresist to remove said exposed pattern; and isotropically developing said first layer of photoresist under said exposed pattern of said second layer and under a portion of said second layer of photoresist around said openings to form in said first layer of photoresist a plurality of cavities, each having an opening at its top surrounded by an overhanging lip of said second layer of photoresist.

16. The method of claim 15 wherein said step of exposing at least portions of said first layer of photoresist to light comprises substantially uniformly exposing said first layer of photoresist to light.

17. The method of claim 15 wherein said step of exposing at least portions of said first layer of photoresist to light comprises exposing said first layer to a pattern of light having light patterns corresponding to and larger than the light patterns of said pattern of light to which said second layer of photoresist is exposed.

* * * * *